United States Patent [19]
Kusunoki et al.

[11] Patent Number: 5,830,794
[45] Date of Patent: Nov. 3, 1998

[54] METHOD OF FABRICATING SEMICONDUCTOR MEMORY

[75] Inventors: Masanori Kusunoki, Hyogo-ken; Makoto Tanaka, Kakogawa, both of Japan

[73] Assignee: Ricoh Company, Ltd., Tokyo, Japan

[21] Appl. No.: 810,761

[22] Filed: Mar. 5, 1997

[30] Foreign Application Priority Data

Mar. 11, 1996 [JP] Japan ................................. 8-052915

[51] Int. Cl.⁶ ................................................ H01L 21/336
[52] U.S. Cl. ................................... 438/266; 438/257
[58] Field of Search .............................. 438/257, 258, 438/260, 264, 263, 266

[56] References Cited

U.S. PATENT DOCUMENTS

| | | | |
|---|---|---|---|
| 4,852,062 | 7/1989 | Baker et al. ........................ | 438/257 |
| 5,210,047 | 5/1993 | Woo et al. ........................... | 438/263 |
| 5,215,933 | 6/1993 | Araki .................................. | 438/257 |
| 5,268,318 | 12/1993 | Harari ................................ | 438/263 |
| 5,427,963 | 6/1995 | Richart et al. ..................... | 438/257 |
| 5,429,971 | 7/1995 | Yang .................................. | 438/258 |
| 5,467,308 | 11/1995 | Chang et al. ...................... | 257/314 |
| 5,494,838 | 2/1996 | Chang et al. ...................... | 438/264 |
| 5,541,130 | 7/1996 | Ogura et al. ...................... | 438/266 |

*Primary Examiner*—Jey Tsai
*Assistant Examiner*—Michael S. Lebentritt
*Attorney, Agent, or Firm*—Cooper & Dunham LLP

[57] ABSTRACT

Methods of fabricating electrically alterable non-volatile semiconductor memory cells are provided. The methods include the steps of forming consecutively two paris of side walls defined at least partially by a floating gate, a control gate and dielectric layers to which dopant implantation into source region is self-aligned. Using such side walls provides accurate channel lengths of select gate transistors for uniform memory cell characteristics.

17 Claims, 5 Drawing Sheets

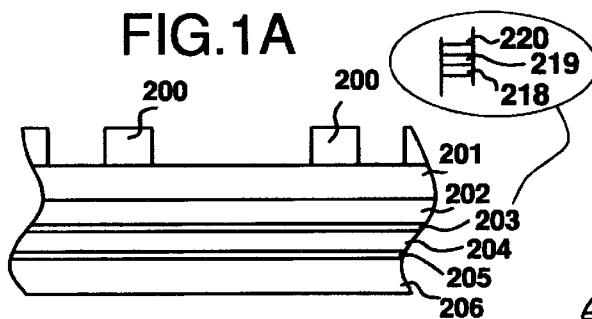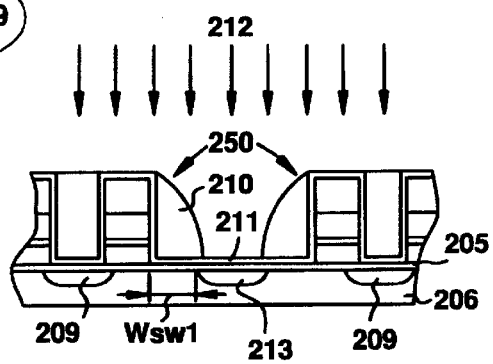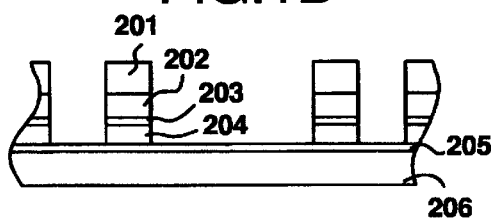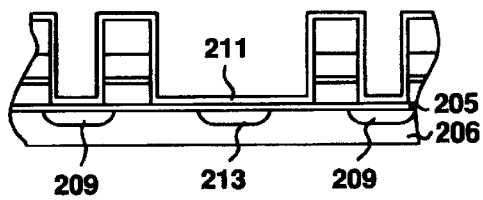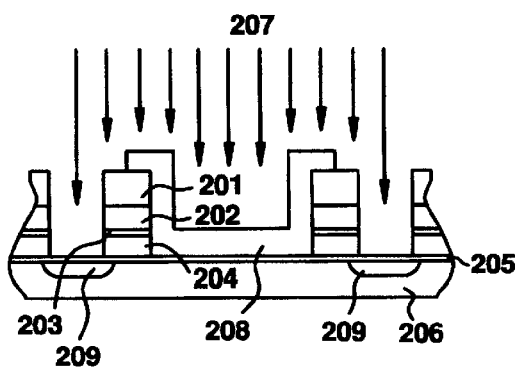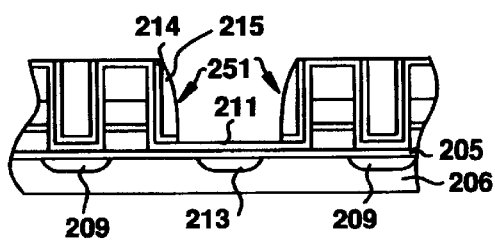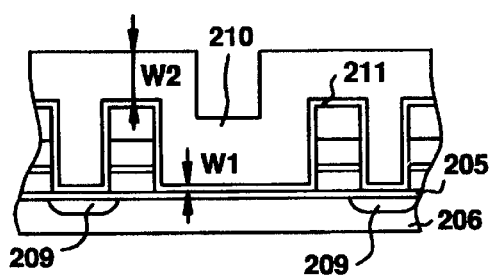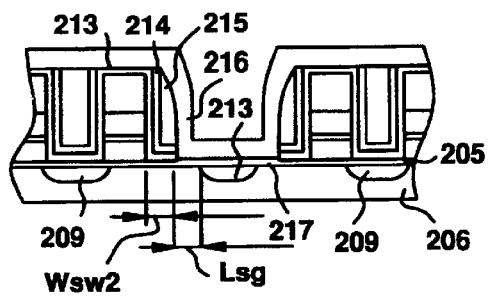

5,830,794

METHOD OF FABRICATING SEMICONDUCTOR MEMORY

BACKGROUND

1. Field of the Invention

This invention generally relates to electrically alterable non-volatile semiconductor memory devices having floating gate structures and, more particularly, to methods of fabricating the devices.

2. Description of the Related Art

Numerous electrically alterable non-volatile semiconductor memory devices have been developed. In these devices electrical charge is transferred into an electrically isolated gate or floating gate to represent one binary state while an uncharged gate represents the other binary state. Typically, EEPROMs and particularly flash EEPROMs which occupy less memory bit area have recently received considerable attention.

For flash EEPROMs, various structures and operational methods have been developed. For example, among the various types of flash EEPROMs developed, BMI-type of flash EEPROMs have been developed and are discussed in U.S. Pat. No. 5,280,446.

FIG. 4 is a section view of a BMI type flash memory device in which a source 12, a drain 13 and a channel region 14 between the source and drain are formed in a substrate 13. A floating gate 16 and a control gate 17 are formed on an underlying gate dielectric layer and cover a portion of the channel region. In addition, a second dielectric layer is disposed over the control gate, and a select gate 18 is formed on the second dielectric layer and extends over the source 12, the drain 13 and the channel region 14.

With the provision of the select gate, the above-mentioned cell structure avoids an over-erase problem and results in hot carrier injection that is more efficient in a source side channel region than channel hot electron injection, which is advantageous for single and/or low voltage device operation.

As illustrated in FIG. 5, by providing the control gate 17 and select gate 18, access to a certain memory cell can be achieved by selecting these gates in a matrix-wise fashion. In addition, by arranging the cells in a NOR non-contract fashion and by sharing each of a source line and a drain line between neighboring cells, a reduction of bit areas of the memory cell can be achieved. The BMI type flash memory is suitable for low voltage operation and miniaturization of the device.

FIGS. 6a–6g represent views of the BMI type flash memory cell along cross section AA of the structure of FIG. 5 during various stages in the manufacturing process. In FIG. 6a well regions and oxides for cell isolation are provided on in a p-type semiconductor substrate 106. On top of the substrate, there are disposed a tunnel oxide 105, a floating gate 104, and a part of inter-poly dielectric layer 103 which can be a combination of silicon oxide and silicon nitride (ONO). These accumulated layers are subsequently etched to form a stacked-gate structure along the direction of a word line (direction BB in FIG. 5). Thereafter, the remaining part of the inter-poly dielectric layer 103 or a top oxide layer, a control gate 102 and a silicon oxide layer 101 are formed by CVD, followed by the deposition and patterning of a photoresist layer 100 to be used for etching these accumulated layers along a word line (direction CC in FIG. 5).

In FIG. 6b the silicon oxide layer 101, the control gate layer 102, the inter-poly dielectric layer 103 and the floating gate layer 104 are etched using photoresist layer 100 as a mask to form a stacked gate structure.

The FIG. 6c a photoresist layer 108 is then disposed and subsequently defined employing known photolithographic techniques to form a mask which exposes a region of the source line common to the neighboring memory cells. Thereafter, n-type dopants, such as arsenic, are implanted into the common source line 110. The implantation for the common drain line 109 is thus defined by self-alignment, while by the position of a mask for the common source line 110. A silicon oxide layer 113, silicon nitride layer 112 and silicon oxide layer 111 are then formed by, for example, CVD, as seen in FIG. 6d.

In FIG. 6e the above silicon oxide layer 111 and the silicon nitride layer 111 are back-etched by a dry etching method to such an extent that the silicon oxide layer 113 remains in the region in which a gate dielectric layer 114 for the select gate 115, seen in FIG. 6g, is subsequently formed, thereby forming a pair of opposite side walls 116 defined by the silicon oxide layers 111 and 113, and the silicon nitride layer 112.

In FIG. 6f the silicon oxide layer 113 and the tunnel oxide 105 are then removed by wet chemical etching from the regions in which gate oxide 114 and common drain line 109 are subsequently formed.

Thereafter, the gate oxide layer 114 is thermally grown, followed by the formation of the select gate 115. Subsequently, peripheral transistors and circuit wiring are formed using conventional techniques.

In the above-mentioned BMI type flash memory cell illustrated in FIG. 6c, the common source line 110 (identified as 12 in FIG. 4) is defined by the alignment of a patterned photoresist layer 108, employing known photolithography techniques. In addition, the length on the channel region, of the select gate 115 (identified as 18 in FIG. 4) is also defined by the mask alignment. As a result, the accuracy and reproducibility of the channel length during the fabrication process of conventional BMI type flash EEPROMs is determined by the accuracy of the mask alignment.

One drawback to this is that dispersion of the channel length generally results in an increase in leakage current in the memory cells and results in a decrease in device characteristics due to a scatter of the threshold voltage of the select transistors.

Therefore, in the fabrication of BMI type memory cells, a degree of tolerance for mask alignment accuracy is therefore needed to achieve uniform cell characteristics.

SUMMARY OF THE INVENTION

An object of the present invention is to provide a method of fabricating memory cells which overcome the above-noted difficulties.

Another object of the invention is to provide a method of implementing source line formation in a self-aligned fashion to form accurate channel lengths for select gate transistors, thereby resulting in memory cells having uniform device characteristic which can be utilized for manufacturing high density devices.

In one embodiment, the present application provides a method of fabricating an electrically programmable non-volatile memory cell that includes forming a stacked-gate structure on a dielectric layer formed on a surface of a semi-conductor substrate. The stacked-gate structure preferably includes a floating gate, a control gate and a select gate successively formed above (or adjacent) a channel region of the substrate. The select gate preferably overlies at least a portion of the channel region. Each wall of a first pair of opposite side walls are formed as a conformal layer defined by the floating gate, a second dielectric layer and the control gate. A common source line is formed in the substrate by doping appropriate dopants (e.g., arsenic) in a self-aligned manner using the first pair of side walls as a mask.

Following the removal of a portion of the first pair of side walls by etch-back, a second pair of opposite side walls are then formed. Each wall of the second pair of side walls is defined at least partially by the floating gate, the second dielectric layer and the control gate. Each wall of the second pair of side walls has a predetermined thickness which is preferably smaller than the thickness of each wall of the first pair side walls. A select gate is formed over at least the second pair of opposite side walls so that an electrically programmable non-volatile memory cell is formed.

In the present application, the thickness of the conformal layer, determines the distance between the side walls, and determines the position of the common source line. Accordingly, the source line position is not determined by the position of a photoresist mask during a photolithography process, but by the position of the conformal layers to which the common source line is self-aligned.

Further, the channel length in the select gate transistor is determined by the thickness of one wall of the first pair of side walls subtracted by the thickness of one wall of the second pair of side walls. Hereinafter, the above-mentioned thickness of one wall of each of the first and second pair of the side walls is referred to as the first and second side wall thickness, respectively. The uniformity of these side wall thicknesses during the fabrication process ensures uniform and reproducible channel lengths in the select gate transistors. As a result, the characteristics of the memory cell according to the present application are uniform.

In addition, the materials used to construct the conformal layers are selected so as to facilitate this uniform and reproducible construction during fabrication.

BRIEF DESCRIPTION OF THE DRAWINGS

Preferred embodiments of the invention are described hereinbelow with references to the drawings wherein:

FIGS. 1a through 1h are cross sections a memory cell during various stages in the manufacturing process in accordance with a first embodiment of this invention;

DETAILED DESCRIPTION

Figure 5:
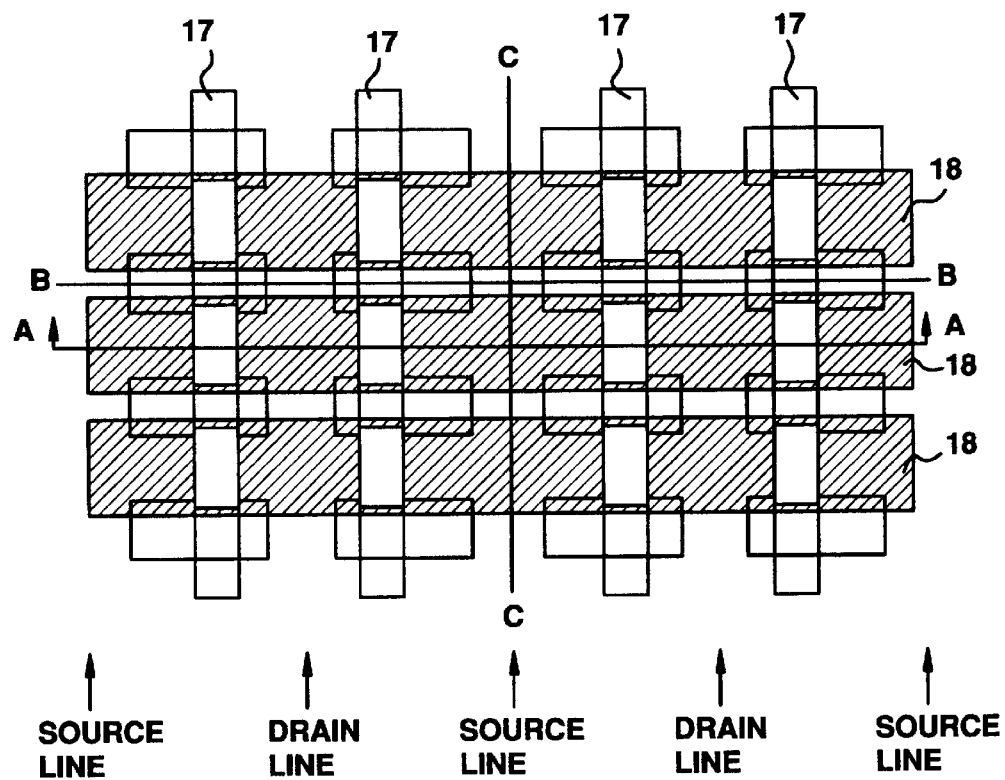
FIG. 5 is a topological view of the BMI type of flash EEPROM memory cell of FIG. 4.
Figure 6A:
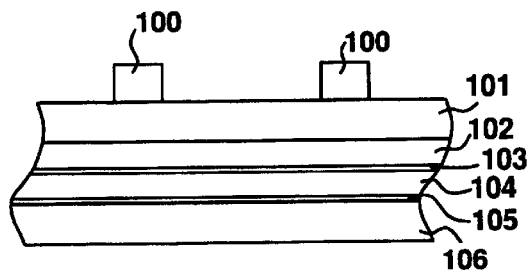
FIGS. 6a through 6g are cross sections of the BMI type of flash EEPROM memory cell of FIG. 4 during various stages in the manufacturing process.
Figure 6B:
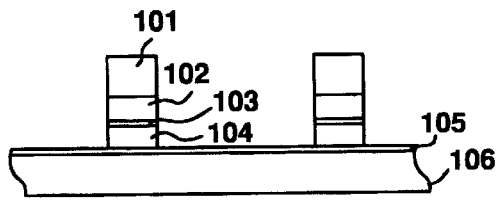
Figure 6C:
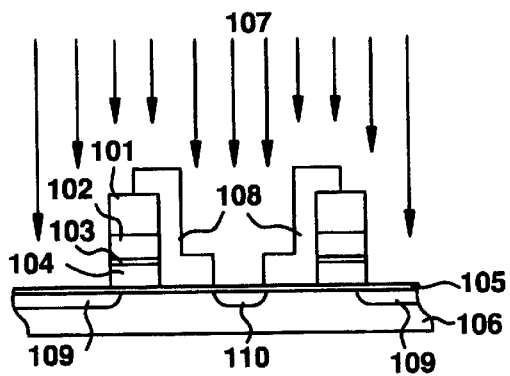
Figure 6D:
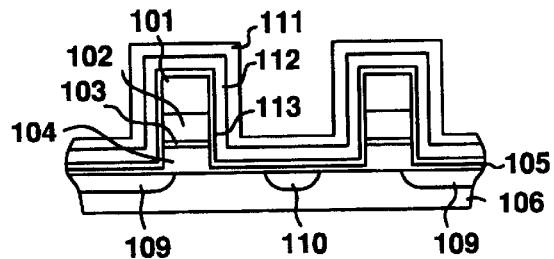
Figure 6E:
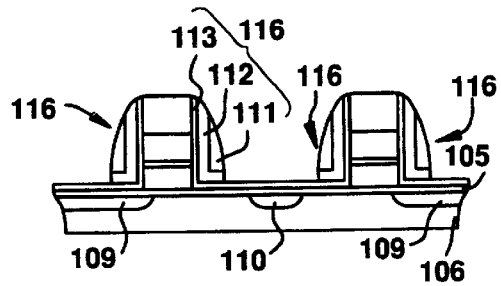
Figure 6F:
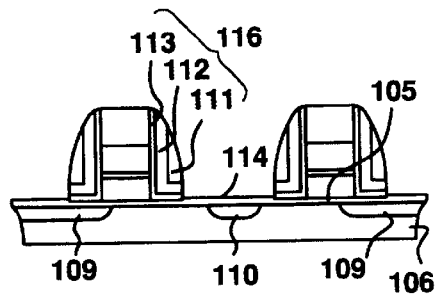
Figure 6G:
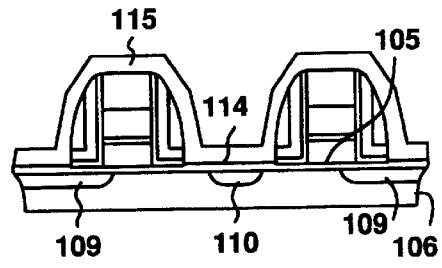

Referring to the drawing, FIGS. 1a through 1h present views of a BMI type flash EEPROM memory cell during various stages in the manufacturing process in accordance with a first embodiment of the present invention. It should be noted that the overall structure of the flash EEPROM according to the present application is similar to the overall structure of the flash EEPROM seen in FIG. 5. However, the structure of the various layers forming each memory cell and the process for the fabrication of such cells are different between the EEPROM of FIG. 5 and the EEPROM according to the present application.

The memory cell includes a p-type semiconductor substrate 206 having well regions and oxides for field isolation. Disposed on one surface (e.g., the top) of the substrate, are a tunnel oxide layer 205 having a thickness ranging from between about 7 and about 10 nanometers, a polysilicon layer 204 forming a floating gate having a thickness ranging from between about 100 and about 150 nanometers, and an inter-poly dielectric layer 203. The inter-poly layer (or ONO layer) includes a bottom oxide layer 218 having a thickness ranging from between about 5 and about 15 nanometers, and a silicon nitride layer 219 having a thickness ranging from between about 5 and about 15 nanometers. The inter-poly layer 203 can be formed from a combination of silicon oxide and silicon nitride.

The layers of silicon nitride 219, silicon oxide 218 and the floating gate layer 204 are subsequently etched to form a stacked-gate structure along a word line direction (see, for example, direction BB in FIG. 5) of the memory cell. Thereafter, a top oxide layer 220 having a thickness ranging from between about 5 and about 15 nanometers is disposed as a remaining layer of the inter-poly dielectric layer 203. In addition, a polysilicon layer 202 having a thickness ranging from between about 100 and about 150 nanometers, and a silicon oxide layer 201 having a thickness from between about 200 and about 350 nanometers are respectively disposed on the inter-poly dielectric layer 203. The polysilicon layer 202 forms a control gate. A photoresist layer 200 is formed on the silicon oxide layer 201 and is used as a mask for etching the accumulated layers along a bit line direction (see, for example, direction CC in FIG. 5) of the memory cell.

Subsequently, the layers of silicon oxide 201, control gate 202, inter-poly dielectric 203, and the floating gate 204 are etched using the photoresist layer 200 as a mask, to form a stacked gate structure, as seen in FIG. 1b.

In FIG. 1c a photoresist layer is then disposed and subsequently photodefined to form a mask 208 which exposes a region of the drain line 209 common to neighboring two memory cells while protecting a region of a common source line 213, seen in FIG. 1e. Thereafter, with the use of the mask 208, implantation of, for example, arsenic as an n-type dopant into the common drain region 209 is performed with an ion dose of approximately $5 \times 10^{15}$ cm$^{-2}$ and an energy of approximately 100 keV.

A silicon nitride layer 210 and a silicon oxide layer 211 are formed on the stacked-gate structure and the tunnel oxide layer 205, as seen in FIG. 1d by, for example CVD. A thickness (W1) of the silicon oxide layer 211 ranges from between about 5 and about 10 nanometers, and a thickness (W2) of the silicon nitride layer 210 is approximately 600 nanometers.

In FIG. 1e the silicon nitride layer 210 is etch-backed by, for example a dry etching method, to such an extent that the silicon oxide layer 211 remains in the region of common source line 213, thereby forming a first pair of opposite side walls 250 defined by of the silicon oxide layer 211 and silicon nitride layer 210. Thereafter, implantation of an n-type impurity 212 (e.g., arsenic) into the region of the silicon oxide layer 211 exposed after the silicon nitride layer 210 is etched-back to form the common source line 213 in a self-aligned manner. Preferably, the impurities are implanted with an ion dose of approximately $5 \times 10^{15}$ cm$^{-2}$ and an energy of approximately 100 keV.

Subsequently, as seen in FIG. 1f, the remaining portion of the silicon nitride layer 210 is removed by, for example, wet chemical etching with hot phosphoric acid so that the silicon oxide layer 201 and tunnel oxide layer 205 are covered with the silicon oxide layer 211.

Referring now to FIG. 1g, a silicon nitride layer 214 and a silicon oxide layer 215 are then formed on the silicon oxide layer 211. Preferably, each layer 214 and 215 has a thickness ranging from between about 20 and about 40 nanometers. The silicon oxide layer 215 is then etched back, using for example a dry etching method, to such an extent that the silicon oxide layer 211 remains in a region in which a gate dielectric layer 217 forming a selection gate is subsequently disposed (see FIG. 1h), thereby forming a second pair of opposite side walls 251 defined by the silicon oxide layer 211, the silicon nitride layer 214 and the silicon oxide layer 215.

Subsequently, in FIG. 1h the silicon oxide layer 211 and the tunnel oxide layer 205 in the region between the second pair of opposite side walls 251 are removed by, for example, wet chemical etching with an aqueous solution of hydrofluoric acid. In addition, the silicon oxide layer 211 adjacent the common drain regions 209 is removed by, for example, wet chemical etching with an aqueous solution of hydrofluoric acid.

The gate dielectric layer 217 is then formed in the region between the second pair of opposing side walls 251. Preferably, the gate dielectric layer 217 has a thickness ranging from between about 10 and about 20 nanometers. A select gate 216 is then formed at least on the gate dielectric layer and extending over the stacked-gate structures, as seen in FIG. 1h.

Subsequently, peripheral transistors and circuit wiring can be formed using to conventional techniques.

As above-mentioned, according to the fabrication process of the present application, the position of the common source line 213 during formation is determined by the distance between walls of the first pair of side wall 250. This results in a channel length ($L_{sg}$) of the selection gate transistor 216 which is a difference between one side wall thickness ($W_{sw1}$) of the first pair of side walls and one side wall thickness ($W_{sw2}$) of the second pair of side walls. The thickness of each side wall can be formed substantially the same for each memory cell, thus, the channel length of each select gate transistor can also be formed substantially the same. This ensures uniform cell characteristics.

For select gate transistors of submicron devices, the above-mentioned channel length $L_{sg}$ and each of the side wall thickness $W_{sw1}$ and $W_{sw2}$ are approximately 350, 30 and 100 nanometers, respectively. In addition, if n-type dopants are implanted into the region of the common source line 213 with an implantation range of about 50 nanometers, and if the thickness of the tunnel oxide layer 205 ranges from between about 7 and about 10 nanometers, the thickness of the silicon oxide layer 211 (W1) is preferably about 40 nanometers.

Furthermore, if the thickness of the silicon oxide layer 211 is decreased when the silicon nitride layer 210 is etched back, so that the thickness of the silicon oxide layer 211 is at least 5 nanometers, the resulting thickness of the silicon nitride layer 210 is preferably between about 350 and about 400 nanometers to form each wall of the first pair of the side walls 250. Accordingly, with the decrease in thickness during the etching process taken into consideration, the thickness (W2) of the silicon nitride layer 210 before etching preferably ranges from between about 400 and about 600 nanometers.

Instead of the silicon nitride layer 210 mentioned above, a polysilicon or amorphous silicon layer may be employed. Also, instead of using the silicon oxide layer 201, a single layer or multilayer thin dielectric can be used. In addition, by adjusting the thickness of the silicon oxide layer 201, or the single layer of multilayer dielectric, the overall thickness of the first pair of opposite side walls can be optimized.

FIG. 2 represents a sectional view of a memory cell according to a second embodiment of the present application. The stacked-gate structure of the memory cell according to the second embodiment is similar to the stacked-gate structure discussed in the first embodiment and shown in FIGS. 1a–1c. Accordingly, the fabrication step in FIG. 2a corresponds to the step shown in FIG. 1d, with a modification that three layers, a silicon oxide layer 301, a silicon nitride layer 302 and a silicon oxide layer 303, are formed in FIG. 2a in place of the silicon oxide layer 211 and the silicon nitride layer 210 of FIG. 1d. The thickness of the silicon oxide layer 301 (W3) and the silicon nitride layer 302 (W4) ranges from between about 10 and about 30 nanometers; and the thickness of the silicon oxide layer 303 (W5) is approximately 600 nanometers.

Figure 2A:
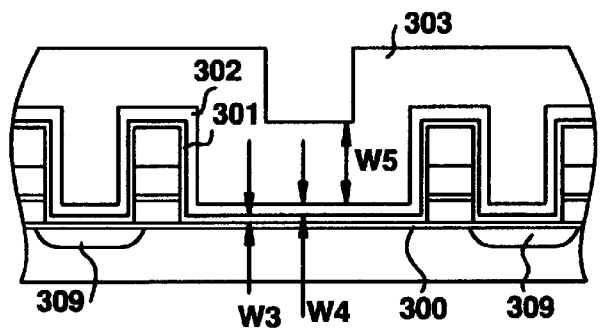
FIGS. 2a through 2e are cross sections the memory cell during various stages in the manufacturing process in accordance with a second embodiment of this invention.
Figure 2B:
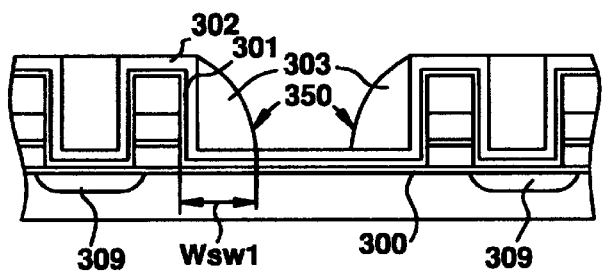
Figure 2C:
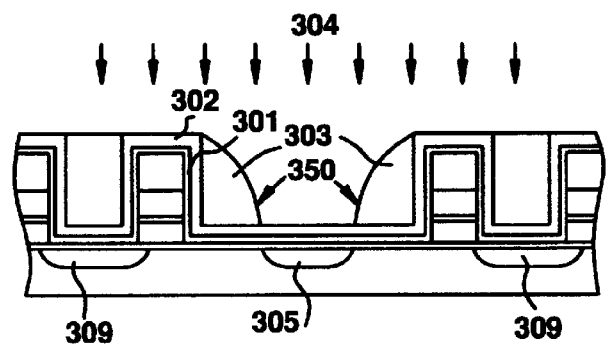

In FIG. 2b the third silicon oxide layer 303 is etched back by, for example, a dry etching method to such an extent that the silicon nitride layer 302 and silicon oxide layer 303 remain in a region for forming common source line 305, seen in FIG. 2c, so that a first pair of opposite side walls 350 are defined by the silicon oxide layer 301, the silicon nitride layer 302 and the silicon oxide layer 303. Thereafter, impurities 304, such as arsenic ions as an n-type dopant, are implanted in the region between the first pair of side walls 350 to form the common source line 305 in a self-aligned manner. Preferably, the ions are implanted with an ion dose of approximately $5 \times 10^{15}$ cm$^{-2}$ and an energy of approximately 100 keV.

Figure 2D:
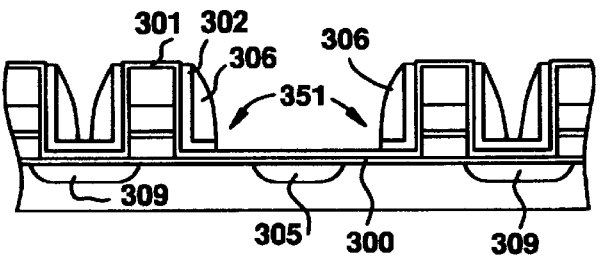

Subsequently, in FIG. 2(d) the silicon oxide layer 303 is removed by, for example, wet chemical etching with an aqueous solution of hydrofluoric acid, and a silicon oxide layer 306 is then formed with a thickness ranging from between about 20 and about 40 nanometers. The silicon oxide layer 306 and silicon nitride layer 302 are then etched back, by for example a dry etching method, to such an extent that the silicon oxide layer 301 remains in a region in which a gate dielectric layer forming a select gate is subsequently formed, to form a second pair of opposite side walls 351 defined by the silicon oxide layer 301, the silicon nitride layer 302 and the silicon oxide layer 306.

Figure 2E:
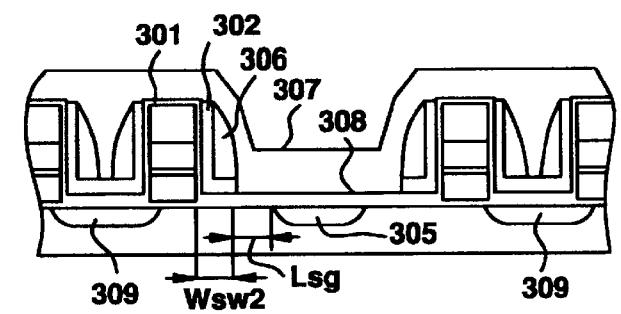

Subsequently, in FIG. 2e a part of the silicon oxide layer 301 and the tunnel oxide layer between the second pair of side walls 351 are removed by, for example, wet chemical etching with aqueous solution of hydrofluoric acid. In addition, the silicon oxide layer 301 and tunnel oxide layer are removed from the region adjacent the common drain regions 309. Thereafter, a gate oxide layer 308 is formed in the region between the second pair of side walls 351. Preferably, the gate oxide layer 308 has a thickness ranging from between about 10 and about 20 nanometers. A select gate 307 is then formed at least on the gate oxide layer 308, as seen in FIG. 2e.

Subsequently, peripheral transistors and circuit wiring can be formed using conventional techniques.

As above described, the channel length of each select gate transistor can be fabricated accurately and uniformly according to this embodiment as well, resulting in satisfactory device characteristics, similar to those according to the first embodiment.

As described in the first embodiment, for select gate transistors in submicron devices, the channel length ($L_{sg}$) is approximately 350 nanometers and the thickness ($W_{sw2}$) of each of the second pair of side walls ranges from between about 30 and about 100 nanometers.

If the thickness of the silicon nitride layer 302 in FIG. 2b is decreased when the silicon oxide layer 303 is etched back, the thickness of the silicon nitride layer 302 should be at least 5 nanometers. Similarly, if the thickness of the silicon oxide layer 301 in FIG. 2d is decreased during the etch-back process of the silicon nitride layer 302, the thickness of the silicon oxide layer 301 should be at least 5 nanometers.

Furthermore, if n-type dopants are implanted into the region forming the common source line 305 have an implantation range of the order of 50 nanometers or less and if the thickness of the tunnel oxide layer is between about 7 and about 10 nanometers, the thicknesses W3 and W4 of both of the silicon oxide layer 301 and the silicon nitride layer 302 respectively are preferably between about 5 and about 20 nanometers. The thickness of each of the layers may be determined by optimizing the magnitude of leak current between the control gate and the select gate.

Accordingly, in FIG. 2b the thickness of the silicon oxide layer 303 is between about 350 and about 450 nanometers as a part of the first pair of side walls, or from between about 400 and about 600 nanometers if a decrease in thickness during the etching process is considered in the present embodiment.

Referring now to FIG. 3, a sectional view of a memory cell according to a third embodiment of the present application will be described. The stacked-gate structure of the memory cell according to the third embodiment is similar to the stacked-gate structure discussed in the first embodiment and shown in FIGS. 1a–1c. Accordingly, the fabrication step in FIG. 3a corresponds to the step shown in FIG. 1d, with a modification that two layers, a silicon oxide layer 401 and a silicon nitride layer 402 are employed to define the second pair of side walls. The thickness of each of the silicon oxide layer 401 (W6) and the silicon nitride layer 402 (W7) is between about 20 and about 80 nanometers.

Figure 3A:
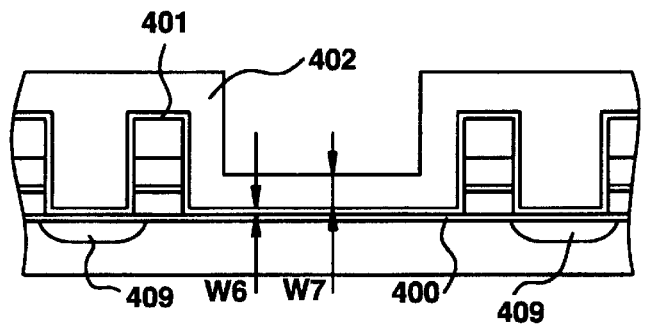
FIGS. 3a through 3e are cross sections the memory cell during various stages in the manufacturing process in accordance with a third embodiment of this invention.
Figure 3B:
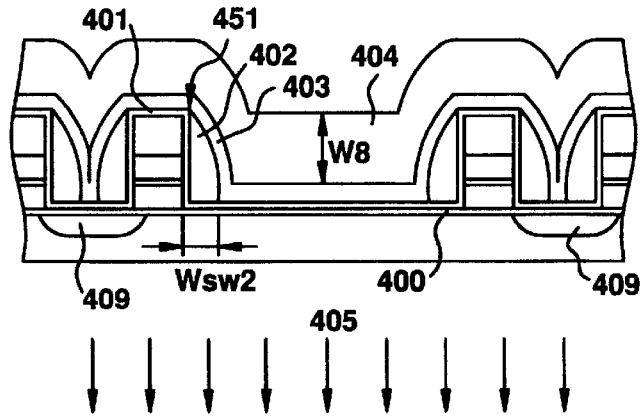

In FIG. 3b the silicon nitride layer 402 is etch-backed by, for example, a dry etching method to such an extent that the silicon oxide layer 401 remains in a region for forming common source line 406 to form the second pair of side walls 451. A silicon nitride layer 403 having a thickness of approximately 10 nanometers is formed on the silicon oxide layer 401 and the silicon nitride layer 402, as seen in FIG. 3b. A silicon oxide layer 404 having a thickness (W8) of approximately 500 nanometers is then disposed on the silicon nitride layer 403.

Figure 3C:
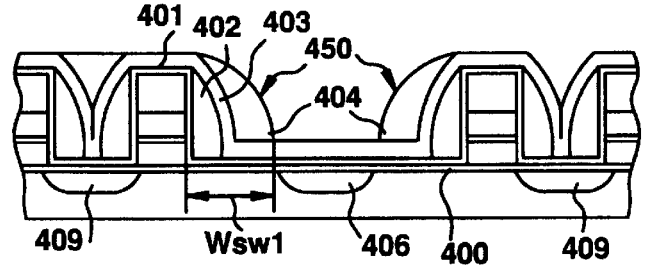

In FIG. 3c the silicon oxide layer 404 is etched back, by for example a dry etching method, to such an extent that the silicon oxide layer 401 and the silicon nitride layer 403 remain in the region for forming the common source line 406, to form a first pair of side walls 450 defined by the silicon oxide layer 401, the silicon nitride layer 402, the silicon nitride layer 403 and the silicon oxide layer 404. The thickness of each wall of the first pair of side walls is defined by $W_{sw1}$. Thereafter, implantation of, for example, arsenic as an n-type dopant 405 into the regions exposed by the removal of above-mentioned layers, is performed in a self-alignment manner with an ion dose of approximately $5 \times 10^{15}$ cm$^{-2}$ and an energy of approximately 100 keV, to form the common source line 406.

Figure 3D:
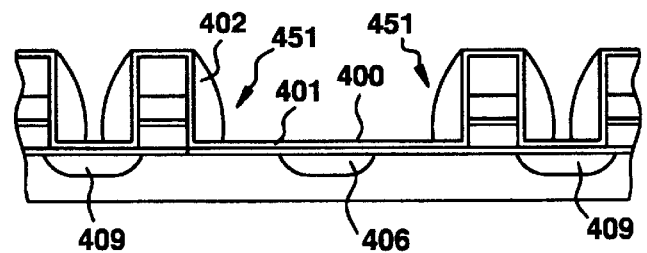

Subsequently, in FIG. 3(d) the silicon oxide layer 404 is removed by, for example, wet chemical etching with an aqueous solution of hydrofluoric acid. In addition, the silicon nitride layer 403 is removed by, for example, a dry etching method so that the second pair of side walls 451 are formed. The thickness of each wall of the second pair of side walls is defined by $W_{sw2}$ and includes the silicon oxide layer 401 and the silicon nitride layer 402.

Figure 3E:
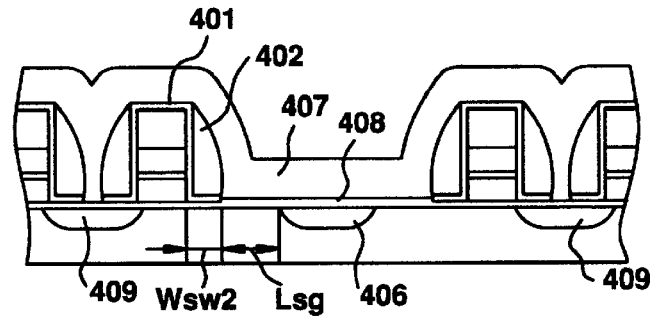
Figure 4:
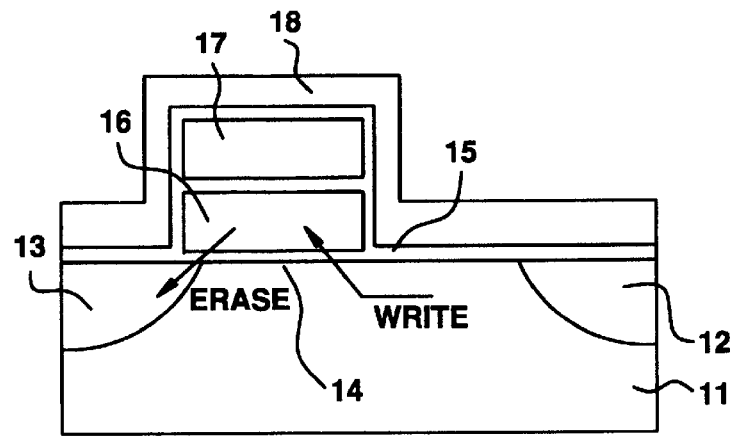
FIG. 4 is a cross section of a prior art BMI type of flash EEPROM memory cell.

The silicon oxide layer 401 and the tunnel oxide layer 400 in the region between the second pair of side walls and in a region adjacent the common drain lines 409 are removed by, for example, wet chemical etching with an aqueous solution of hydrofluoric acid. Thereafter, a gate oxide layer 408 having a thickness ranging from between about 10 and about 20 nanometers is formed at least in the region between the second pair of side walls. A select gate 407 is then formed on the gate oxide layer and the region adjacent the drain lines 409, as seen in FIG. 3e. Subsequently, peripheral transistors and circuit wiring can be formed using conventional techniques.

As described in the previous embodiments, for select gate transistors in submicron devices, the channel length ($L_{sg}$) is preferably 350 nanometers, and the thickness ($W_{sw2}$) of each wall of the second pair of side walls ranges from between about 30 and about 100 nanometers.

In addition, if a decrease in thickness during the etch-back process occurs, the thickness (W6) the silicon oxide layer 401 is preferably from between about 5 and about 20 nanometers, and the thickness (W7) of the silicon nitride layer 402 is preferably between about 30 and about 100 nanometers. Furthermore, in FIG. 3(c) the silicon oxide layer 404 is formed having a thickness (W8) that preferably ranges from between about 5 and about 10 nanometers, to compensate for the decrease in thickness that may occur during the etch-back process.

If the n-type dopants implanted into the region for the common source line 406 have an implantation range of the order of 50 nanometers or less, and if the thickness of the tunnel oxide layer 400 is in the range of between about 7 and about 10 nanometers in submicron devices, the ion implantation into the source line region can be achieved for a layer thickness of from 5 to 20 nanometers and from 5 to 10 nanometers, respectively, for each of the silicon oxide layer 401 and silicon nitride layer 402.

Accordingly, in FIG. 3b the thickness of the silicon oxide layer 404 is between about 350 and about 450 nanometers as a part of the first pair of the side walls, or from between about 400 and about 600 nanometers if a decrease in thickness during the etching process is considered in the present embodiment.

Additional modifications and variations of the present invention are possible in light of the above etchings. It is therefore to be understood that within the scope of the appended claims, the invention may be practiced otherwise than as specifically described herein.

What is claimed is:

1. A method of fabricating an electrically programmable non-volatile memory cell on semiconductor substrate comprising the steps of:

forming a channel region on said semiconductor substrate;

forming a first dielectric layer at least over said channel region;

forming a floating gate over said first dielectric layer;

forming a second dielectric layer at least on said floating gate;

forming a control gate on said second dielectric layer;

forming a select gate overlying at least a portion of said channel region over said floating gate having an underlying third dielectric layer;

forming a first pair of side walls, each wall of said first pair of side walls having a first thickness and being defined at least partially by said floating gate, said second dielectric layer and said control gate;

forming a source line by doping appropriate dopants in a self-aligned manner using said first pair of side walls as a mask;

forming a second pair of side walls after removing a portion of each wall of said first pair of side walls, each wall of said second pair of side walls having a second thickness which is smaller than said first thickness and being defined at least partially by said floating gate, said second dielectric layer and said control gate;

forming a select gate dielectric layer at least between said second pair of side walls; and forming a select gate on said select gate dielectric layer and extending over at least said second pair of side walls to form an electrically programmable non-volatile memory cell.

2. A method of fabricating an electrically programmable non-volatile memory cell on a semiconductor substrate comprising:

forming stacked-gate structures on the semiconductor substrate;

forming a first pair of side walls relative to said stacked-gate structures, each wall of said first pair of side walls having a first thickness;

forming a source line by doping appropriate dopants in self-aligned manner using said first pair of side walls as a mask;

forming a second pair of side walls relative to said stacked-gate structures after removing a portion of each wall of said first pair of side walls, each wall of said second pair of said walls having a second thickness which is smaller than said first thickness;

forming a select gate dielectric layer at least in a region between said second pair of side walls; and forming a select gate on said select gate dielectric layer and extending over at least said second pair of side walls.

3. A method of fabricating an electrically programmable non-volatile memory cell on a semiconductor substrate comprising:

forming a first dielectric layer on a surface of the semiconductor substrate;

forming a floating gate on said first dielectric layer, a second dielectric layer of inter-poly on said floating gate, and a control gate on said second dielectric layer;

forming a thin dielectric film of either a first silicon oxide, a single layer dielectric or a multilayer dielectric;

etching away said layers accumulated over said floating gate, to form stacked-gate structures of the memory cell which run substantially parallel to a bit line;

forming a mask at least over a region defining a source line;

doping appropriate dopants into a region defining a drain line with the use of said mask to form a drain line;

removing said mask;

forming a layer constituted of a second silicon oxide layer and a first silicon nitride layer at least in said region defining said source line, and subsequently etching back said first silicon nitride layer to such an extent that said second silicon oxide layer remains at least on the region defining said source line, to form a first pair of side walls constituted of said second silicon oxide layer and said first silicon nitride layer;

doping appropriate dopants in a self-aligned manner in said region defining a source line using said first pair of side walls as a mask to form a source line;

removing said first silicon nitride layer;

forming onto said second silicon oxide layer, a second silicon nitride layer and a third silicon oxide layer, and subsequently etching back said second silicon nitride layer and third silicon oxide layer to such an extent that said second silicon oxide layer remains at least on the region defining select gate dielectric layer, to form a second pair of opposite side walls constituted of said second silicon oxide layer, second silicon nitride layer and said third silicon oxide layer;

removing said second silicon oxide layer at least from a region for forming a select gate; and forming a select gate dielectric layer and successively a select gate extending over at least said second pair of side walls.

4. The method according to claim 3, wherein a thickness of said thin dielectric film is controlled so as to optimize a distance between walls of said first pair of side walls.

5. The method according to claim 3, wherein each of said second silicon oxide and said first silicon nitride layers have a thickness ranging from between about 5 and about 40 nanometers and from between about 400 and about 600 nanometers, respectively.

6. A method of fabricating an electrically programmable non-volatile memory cell on a semiconductor substrate comprising:

forming a first dielectric layer on a surface of the semiconductor substrate;

forming a floating gate on said first dielectric layer, a second dielectric layer constituted of inter-poly on said floating gate, a control gate and a thin dielectric film on said first dielectric layer to form an accumulation of layers;

etching away said accumulation of layers over said floating gate to form stacked-gate structures of the memory cell which run substantially parallel to a bit line;

forming a mask at least over a region defining a source line;

doping appropriate dopants into a region defining a drain line with the use of said mask to form a drain line;

removing said mask;

forming a layer constituted of a second silicon oxide layer, a first silicon nitride layer and a third silicon oxide layer, and subsequently etching back said third silicon oxide layer to such an extent that said second silicon oxide layer and said first silicon nitride layer remain at least on said region defining a source line, to form a first pair of side walls constituted of said second silicon oxide, said first silicon nitride and said third silicon oxide layers;

doping appropriate dopants in a self-alignment manner in said region defining a source line using said first pair of side walls as a mask to form a source line;

removing said third silicon oxide layer;

forming onto said first silicon nitride layer, a fourth silicon oxide layer, and subsequently etching back said first silicon nitride layer and said fourth silicon oxide layer to such an extent that said layer of said second silicon oxide remains at least on a region defining a select gate dielectric layer, to form a second pair of side walls constituted of said second silicon oxide, said first silicon nitride and said fourth silicon oxide;

removing said second silicon oxide layer at least from a region for forming a select gate; and forming a select gate dielectric layer and successively a select gate extending over at least second pair of side walls.

7. The method according to claim 6, wherein a thickness of said thin dielectric film is controlled so as to optimize a distance between walls of said first pair of side walls.

8. The method according to claim 6, wherein said thin dielectric film is formed from a silicon oxide layer, a single layer dielectric or a multilayer dielectric.

9. The method according to claim 6, wherein each of second silicon oxide and said first silicon nitride layers have a thickness ranging from between about from 5 and about 20 nanometers, and said third silicon oxide layer has a thickness ranging from between about 400 and about 600 nanometers.

10. A method of fabricating an electrically programmable non-volatile memory cell on a semiconductor substrate comprising:

forming a first dielectric layer on a surface of the semiconductor substrate;

forming a floating gate, a second dielectric layer constituted of inter-poly, a control gate and a thin dielectric film on said first dielectric layer to form an accumulation of layers;

forming a thin dielectric film on said accumulation of layers;

etching away said accumulation of layers over said floating gate to form stacked-gate structures of the memory cell which run substantially parallel to a bit line;

forming a mask at least over a region defining a source line;

doping appropriate dopants into a region defining a drain line with the use of said mask to form a drain line;

removing said mask;

forming a layer constituted of a second silicon oxide layer and a first silicon nitride layer, and subsequently etching back said first silicon nitride layer to such an extent that said second silicon oxide layer remains at least on said region defining a source line, to form a first pair of side walls constituted of said second silicon oxide layer and said first silicon nitride layer;

doping appropriate dopants in a self-aligned manner with the use of said first pair of side walls as a mask to form a source line;

forming onto said first silicon nitride layer, a second silicon nitride layer and a third silicon oxide layer, and subsequently etching back said third silicon oxide layer to such an extent that said layer of said second silicon oxide and said second silicon nitride layer remain at least on a region defining selection gate dielectric layer, to form a second pair of side wall constituted of said second silicon oxide layer, said first and second silicon nitride layers and said third silicon oxide layer;

removing said second silicon nitride layer and said third silicon oxide layer;

removing said second silicon oxide layer form at least on a region for forming a selection gate; and forming a selection gate dielectric layer and successively a select gate extending over at least said second pair of side walls.

11. The method according to claim 10, wherein a thickness of said thin dielectric film is controlled so as to optimize a distance between walls of said first pair of side walls.

12. The method according to claim 10, wherein said thin dielectric film is formed from a silicon oxide layer, a single layer dielectric or a multilayer dielectric.

13. The method according to claim 10, wherein each of said second and third silicon oxide layers, and first silicon nitride layer have a thickness ranging between about from 5 and about 20 nanometers, between about 400 and about 600 nanometers, and between about 30 and about 100 nanometers, respectively.

14. A method of fabricating an electrically programmable non-volatile memory cell on a semiconductor substrate comprising:

forming a first dielectric layer on a surface of the semiconductor substrate;

forming a floating gate, a second dielectric layer constituted of inter-poly, a control gate and a thin dielectric film on said first dielectric layer to form an accumulation of layers;

etching away said accumulation of layers over said floating gate to form a stacked-gate structure of the memory cell which runs substantially parallel to a bit line;

forming a mask at least over a region defining a source line;

doping appropriate dopants into a region defining a drain line with the use of said mask to form a drain line;

removing said mask;

forming a layer constituted of a second silicon oxide layer and a polysilicon or amorphous silicon layer, and subsequently etching back said polysilicon or amorphous silicon layer to such an extent that said second silicon oxide layer remains at least on said region defining a source line, to form a first pair of side walls constituted of said second silicon oxide layer and said polysilicon or amorphous silicon layer;

doping appropriate dopants in a self-alignment manner in said region defining a source line using said first pair of side walls as a mask to form a source line;

removing said polysilicon or amorphous silicon layer;

forming onto said second silicon oxide layer, a silicon nitride and a third silicon oxide layer in that order from bottom, and subsequently etching back said silicon nitride layer and said third silicon oxide layer to such an extent that said layer of said second silicon oxide remains at least on a region defining a selection gate dielectric layer, to form a second pair of side wall constituted of said second silicon oxide, said silicon nitride and said third silicon oxide layers;

removing said second silicon oxide layer at least from a region for forming a select gate; and forming a select gate dielectric layer and successively a select gate extending over at least the second pair of side walls.

15. The method according to claim 14, wherein a thickness of said thin dielectric film is controlled so as to optimized a distance between walls of said first pair of side walls.

16. The method according to claim 14, wherein said thin dielectric film is formed from a silicon oxide layer, a single layer dielectric or a multilayer dielectric.

17. The method according to claim 14, wherein each of said second silicon oxide and polysilicon or amorphous silicon layers has a thickness from between about 5 and about 40 nanometers, and from between about 5 and about 20 nanometers respectively.

* * * * *